(12) United States Patent
Happ et al.

(10) Patent No.: US 7,215,564 B2
(45) Date of Patent: May 8, 2007

(54) SEMICONDUCTOR MEMORY COMPONENT IN CROSS-POINT ARCHITECTURE

(75) Inventors: Thomas D. Happ, Pleasantville, NY (US); Ralf Symanczyk, München (DE)

(73) Assignee: Infineon Technologies AG, Munich (DE)

( * ) Notice: Subject to any disclaimer, the term of this patent is extended or adjusted under 35 U.S.C. 154(b) by 76 days.

(21) Appl. No.: 11/115,953

(22) Filed: Apr. 27, 2005

(65) Prior Publication Data

US 2005/0254291 A1 Nov. 17, 2005

(30) Foreign Application Priority Data

Apr. 27, 2004 (DE) .................. 10 2004 020 575

(51) Int. Cl.
*G11C 17/06* (2006.01)
(52) U.S. Cl. ...................... 365/105; 365/175
(58) Field of Classification Search .............. 365/105, 365/175, 148, 163
See application file for complete search history.

(56) References Cited

U.S. PATENT DOCUMENTS 5,640,343 A 6/1997 Gallagher et al.
2003/0193053 A1 10/2003 Gitton
2004/0124407 A1* 7/2004 Kozicki et al. ............ 257/9
2006/0056227 A1* 3/2006 Parkinson ............... 365/148

OTHER PUBLICATIONS

Kolobov, A. V., et al., "On the mechanism of photodoping in vitreous chalcogenides," Philosophical Magazine B, vol. 61, No. 5, 1990, pp. 859-865.
Parkin, S.S.P., et al., "Exchange-biased magnetic tunnel junctions and application to nonvolatile magnetic random access memory (invited)," Journal of Applied Physics, vol. 85, No. 8, Apr. 15, 1999, pp. 5828-5833.
Kozicki, M.N., et al., "Applications of Programmable Resistance Changes in Metal-Doped Chalcogenides," Electrochemical Society Proceedings, vol. 99, No. 13, pp. 298-309.

* cited by examiner

*Primary Examiner*—Vu A. Le
(74) *Attorney, Agent, or Firm*—Slater & Matsil, L.L.P.

(57) ABSTRACT

A programmable metallization memory cell with a storage region (3) formed from a chalcogenide glass and an electrode (4) which is preferably silver is located at the crossing point of a respective bit line (1) and a respective word line (2). There is a pn junction between the bit lines (1) and the chalcogenide glass.

18 Claims, 3 Drawing Sheets

SEMICONDUCTOR MEMORY COMPONENT IN CROSS-POINT ARCHITECTURE

This application claims priority to German Patent Application 102004020575.2, which was filed Apr. 27, 2004 and is incorporated herein by reference.

TECHNICAL FIELD

The present invention relates generally to semiconductor devices, and more particularly to a semiconductor memory component in cross-point architecture.

BACKGROUND

In semiconductor memory components in cross-point architecture, the memory cells are arranged at the crossing points of the bit lines and word lines. The bit lines are in each case arranged parallel to and at a distance from one another, and the word lines, transversely with respect to the bit lines, are likewise arranged parallel to and at a distance from one another. Each bit line crosses each word line at a location at which a respective memory cell is arranged. Resistively switching storage media are generally used for this type of architecture. The memory cell is selected by addressing the bit line and the word line which lead to the respective crossing point. The application of suitable electrical potentials to the bit lines and word lines thus makes it possible to program, read and, if appropriate, erase individual memory cells. The cross-point architecture has the advantage that the surface area taken up by each memory cell is very small.

On the other hand, what are known as disturb effects occur with a cross-point architecture, caused by the fact that during the write, erase and read operations voltages are also present at the memory cells, which have not been selected. Depending on the operating conditions, these voltages are lower by a factor of two or three than those of the selected cells. Nevertheless, during the read operation, for example, the unselected cells may make significant contributions to the flow of current, making it more difficult or even impossible to evaluate the programmed state of the selected cell.

FIG. 5 illustrates how this effect comes about, representing an excerpt from an array of resistive memory cells in rows and columns, which are addressed via word lines and bit lines. In this example, it has been assumed that the memory cell 15 is being addressed via the selected bit line 10 and the selected word line 20. The further memory cell 18 connected to the selected bit line 10 connects the selected bit line 10 to the unselected word line 21, which is connected to the unselected bit line 11 via the further memory cell 17. The unselected bit line 11 for its part is connected to the selected word line 20 via the further memory cell 14, so that a flow of current via the current path 8 indicated by dashed lines contributes to the overall flow of current between the selected lines 10 and 20. A similar state of affairs also applies to the other memory cells of the array that are not directly connected to the selected lines. By way of example, a current flows between the selected lines 10 and 20 via the further memory cells 14, 12 and 13 and 16, 19 and 18, which are also indicated in FIG. 5.

An additional select transistor or an additional select diode for each memory cell is used to eliminate this problem. Proposals made in this connection are to be found, for example, in U.S. Pat. No. 5,640,343 and in the publication by S. S. P. Parkin et al., "Exchange-biased magnetic tunnel junctions and application to nonvolatile magnetic random access memory", in Journal of Applied Physics 85, 5828–5833 (1999). However, the additional components increase the surface area taken up by each memory cell and also the complexity of the production process.

The publication by M. N. Kozicki et al., "Applications of programmable resistance changes in metal-doped chalcogenides", in Electrochemical Society Proceedings 99–13, 298–309 (1999) has described a programmable metalization memory cell (PMC), which is suitable for use in programmable ROM components. A PMC of this type comprises a storage region formed from a chalcogenide glass, in particular arsenic sulfide or germanium selenide, which is doped, for example, with silver atoms. As an alternative to silver, it is also possible to use copper for the doping. The metal atoms are incorporated in the chalcogenide glass. In the unprogrammed state, a low electrical conductivity results, substantially on account of ion transport, so that the electrical resistance is high compared to typical metals. Undoped chalcogenides, such as GeSe or GeS, and Ag-doped chalcogenides are p-conducting.

A metal-doped chalcogenide glass is also referred to as a solid-state electrolyte. If electrodes are applied to a solid-state electrolyte of this type and a voltage is applied to the electrodes, positively charged metal ions migrate from the anode into the chalcogenide glass. Under suitable conditions, the ions are deposited in the chalcogenide glass in the form of a solid metallic deposit, which can ultimately extend from the cathode all the way to the anode. It is in this way possible to produce an electrically conductive connection formed from metal between the electrodes through the solid-state electrolyte. This process can be at least partially reversed by reversing the polarity of the applied electric voltage.

U.S. patent application Publication No. 2003/0193053 A1 describes a memory cell arrangement in cross-point architecture, in which the memory cells are formed by a programmable metalization memory cell with an associated thin-film diode. In the individual memory cell, there is a layer sequence, which includes at least a first layer of a chalcogenide glass, which is n-conductively doped for example with bismuth or lead, and a second layer of a chalcogenide glass, which is doped with silver and is p-conducting, between an interconnect, which represents a lower electrode and comprises, for example, aluminum or copper, and an upper electrode. The pn junction formed as a result is a diode that transmits current substantially in only one direction. It is also pointed out in this document that the diode, which is in each case connected in series with a memory cell of the array, should if possible also have an increased response threshold in the direction in which the current flows, in order to prevent accidental programming of the memory cell, but on the other hand in the blocking direction should have a certain transmission, so that when the contents of the memory are being read by applying a voltage in the blocking direction, a sufficient leakage current can be detected. The diodes integrated in these memory cells reduce the disturb effect of the memory cell arrangement as a whole.

The publication by A. V. Kolobov et al., "On the mechanism of photodoping in vitreous chalcogenides", in Philosophical Magazine B 61 859–865 (1990) has described an investigation into the photodoping of chalcogenide glasses. The layer structures, which were investigated for this purpose, comprise $As_2S_3$, $GeS_2$ and elemental selenium, as well as silver layers provided as electrodes. For the example of a $GeS_2$ film provided with a silver electrode and an aluminum electrode and doped with silver, it is stated that a positive voltage at the silver electrode forces silver ions into the chalcogenide glass and increases the conductivity, whereas after the polarity of the voltage has been reversed the ions are extracted from the doped layer.

SUMMARY OF THE INVENTION

In one aspect, the present invention provides an improved semiconductor memory component in cross-point architecture with programmable metalization memory cells.

In one embodiment, the present invention provides a semiconductor memory device in cross-point architecture with programmable metallization memory cells. The device comprises bit lines arranged parallel to and at a distance from one another, word lines made from electrically conductive material arranged transversely with respect to the bit lines and parallel to and at a distance from one another, and a memory cell arranged at a crossing point of a respective bit line and a respective word line. The memory cell has a storage region between the respective bit line and the respective word line, which includes a chalcogenide glass and a pn junction toward the bit line, and an electrode between the storage region and the respective word line. Other embodiments and variations are also described.

In this memory cell arrangement in cross-point architecture, the programmable metalization memory cells are provided with integrated select diodes that are formed by a pn junction that is present between a chalcogenide glass, in particular arsenic sulfide, germanium sulfide, arsenic selenide or germanium selenide, and an n-conductively doped bit line. On that side of the chalcogenide glass that is remote from the bit line there is an electrode, which may in particular be a silver electrode, so that for the purpose of programming the individual memory cell, metal ions, in particular silver ions, can be forced into the storage region formed from the chalcogenide glass. This phenomenon only takes place at voltages above a critical threshold value and serves to significantly increase the conductivity of the memory cell. No such effect occurs below the threshold voltage. The arrangement described constitutes a series circuit of diode and variable resistance.

BRIEF DESCRIPTION OF THE DRAWINGS

There now follows a more detailed description of examples of the semiconductor memory component with reference to FIGS. 1 to 6. In the drawing.

The following list of reference symbols can be used in conjunction with the figures:

| 1 | Bit line | 12 | Further memory cell |
| 2 | Word line | 13 | Further memory cell |
| 3 | Storage region | 14 | Further memory cell |
| 4 | Electrode | 15 | Addressed memory cell |
| 5 | Dielectric material | 16 | Further memory cell |
| 6 | Metalization | 17 | Further memory cell |
| 7 | Semiconductor body | 18 | Further memory cell |
| 8 | Current path | 19 | Further memory cell |
| 9 | Semiconductor region | 20 | Selected word line |
| 10 | Selected bit line | 21 | Unselected word line |
| 11 | Unselected bit line | | |

DETAILED DESCRIPTION OF ILLUSTRATIVE EMBODIMENTS

Figure 1:
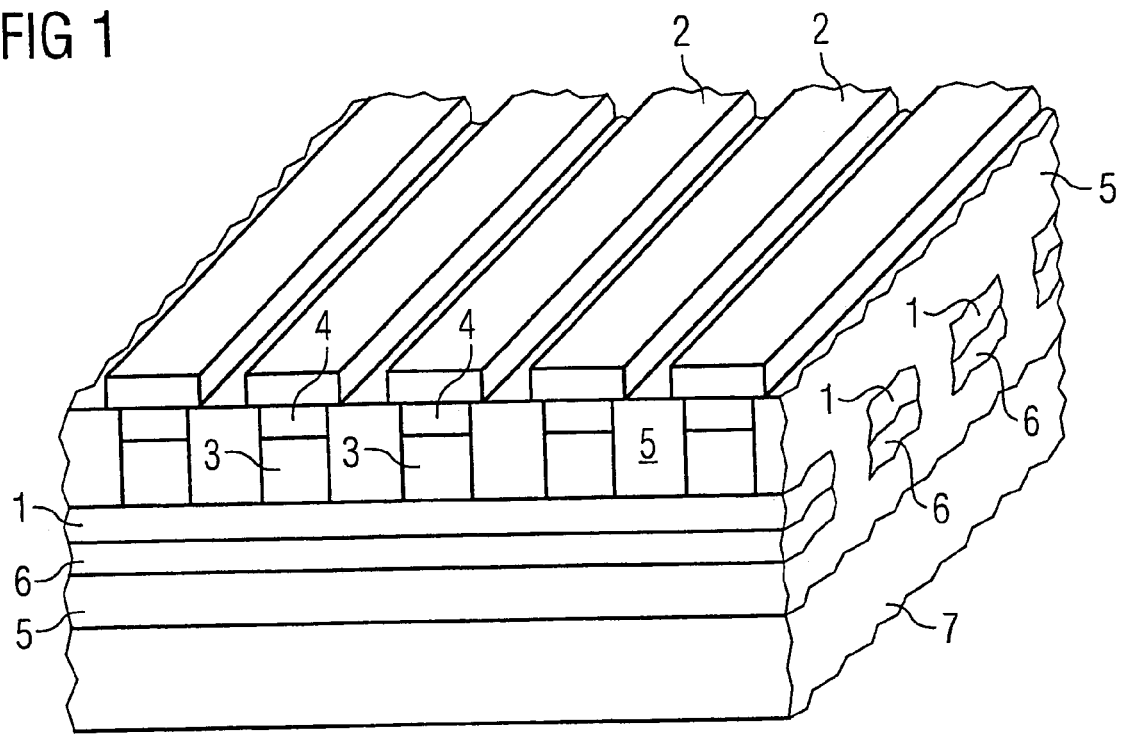
FIG. 1 shows a first exemplary embodiment of the component in the form of an oblique sectional view.

FIG. 1 illustrates a sectional view of a preferred configuration of a semiconductor memory component. The bit lines 1 are arranged parallel to and at a distance from one another below the memory cells, while the word lines 2 are arranged on the top side, running parallel to and at a distance from one another and transversely with respect to the bit lines. The word lines 2 may be a material that is used for interconnect structures, e.g., Al, Cu or W. At a respective crossing point of a corresponding bit line 1 and a word line 2 there is a programmable metalization memory cell, which comprises a storage region 3 and an electrode 4.

The storage region 3 contains a chalcogenide glass that, in combination with the topside electrode 4, forms a programmable metalization memory cell. The chalcogenide glass is undoped and therefore p-conducting at least adjacent to the bit line 1. The bit line is n-doped semiconductor material, e.g., $n^+$-doped polysilicon, so that there is a pn junction as diode between the bit line and the storage region.

Figure 5:
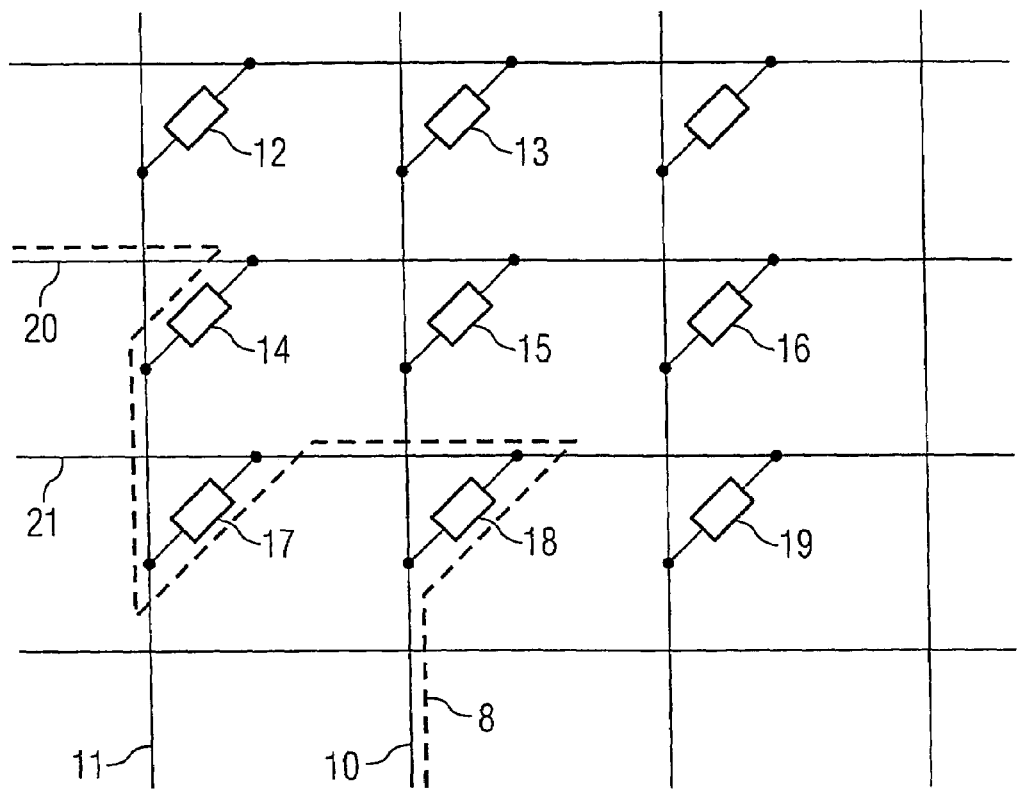
FIG. 5 shows an excerpt from a memory cell matrix.

It can be seen from FIG. 5 that if the diodes of the memory cells are oriented in the same direction, the current path 8 is blocked in both directions, so that the disturb effect is at least substantially prevented from occurring. Between the memory cells and the bit lines there is a dielectric material 5, which has preferably been applied to a substrate, e.g., a semiconductor body 7, which includes the logic components of the driving periphery. The bit lines 1 may be provided with adjacent metalizations 6 formed from a low-resistance material, which reduce the electrical resistance. These metalizations are, for example, tungsten or tungsten silicide.

The arrangement of the storage regions 3 and electrodes 4 may, for example, be produced by contact hole fillings, in a manner which is known from semiconductor technology. If an electrical potential that is positive with respect to the bit line 1 is applied to the word line 2, so that the electrode 4 of the metalization memory cell present at the respective crossing point is positive and the potential is greater than a characteristic threshold value, metal ions are forced into the chalcogenide glass of the storage region. The electrode 4 is preferably silver, but may also be copper. The deposition of metallic silver or copper in the chalcogenide glass increases the conductivity of the storage region, with the result that the memory cell in question is programmed. The application of an electrical potential below the threshold value reads the programming state of the cell.

Figure 6:
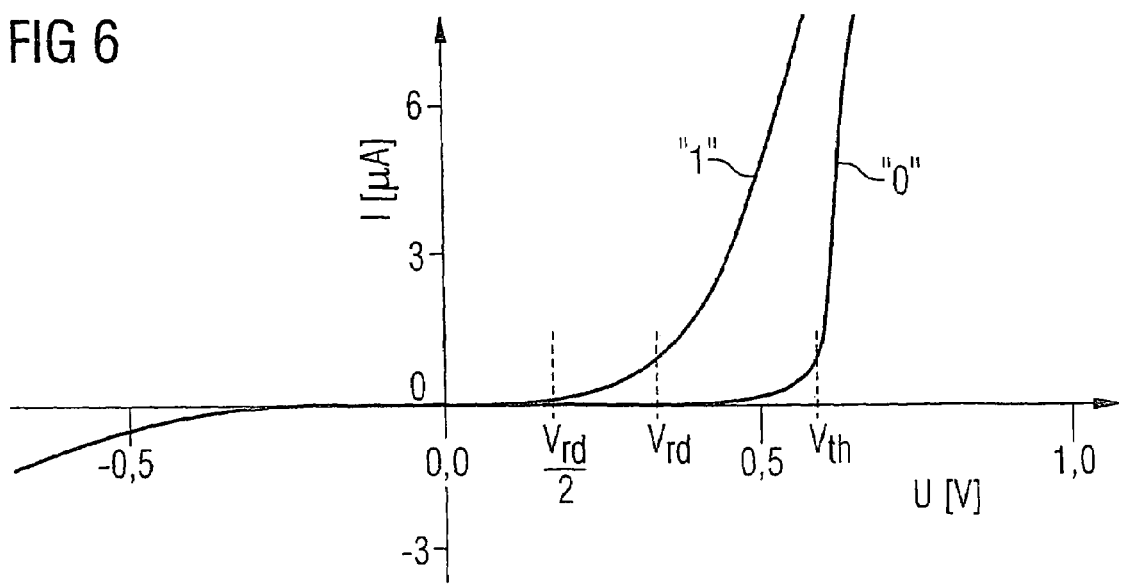
FIG. 6 shows a diagram with current-voltage characteristic curves for two different programming states of the memory cell.

The diagram presented in FIG. 6 illustrates a plot from experimentally determined current-voltage characteristic curves of an individual cell for the programming states "0" and "1". The diagram plots the threshold voltage $V_{th}$ for the programming operation and a typical read voltage $V_{rd}$ for determining the programming state "0" or "1". The nonlinear profile of the characteristic curves, caused by the series connection with a diode, is clearly apparent. The read voltage $V_{rd}$ plotted by way of example makes it clear how the disturb effects are avoided, since at most half the read voltage $V_{rd}/2$ is present at the unselected cells, and therefore no significant contribution is made to the flow of current.

Figure 2:
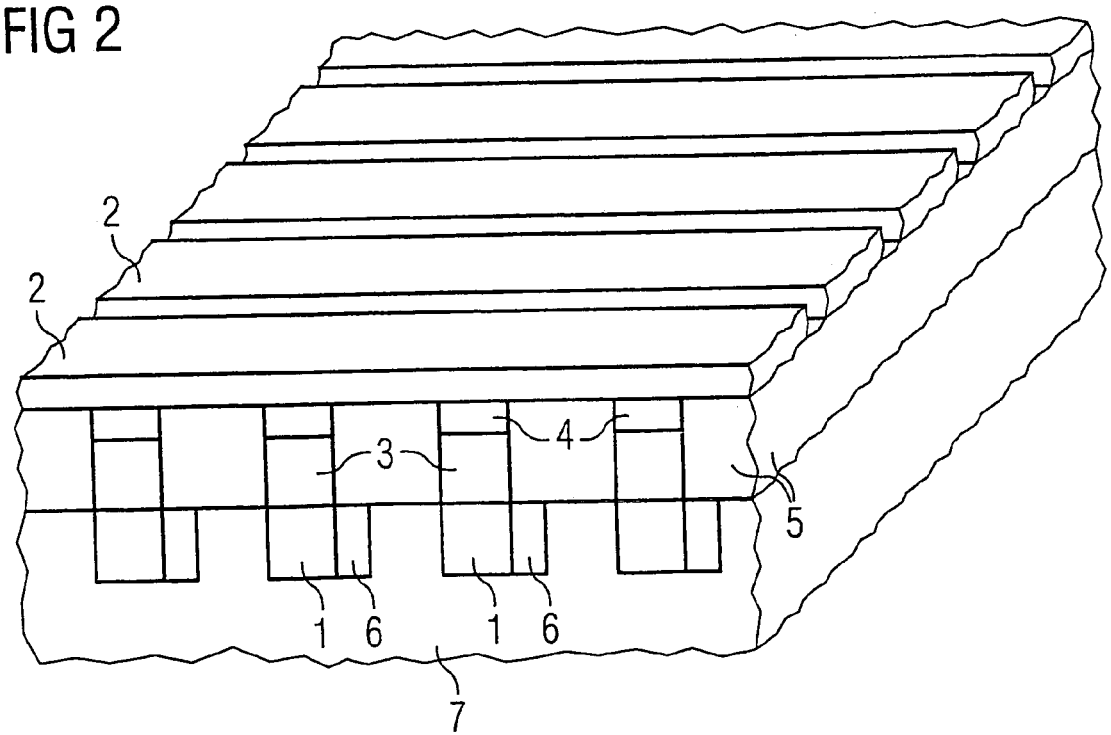
FIG. 2 shows a second exemplary embodiment of the component in the form of an oblique sectional view.

FIG. 2 shows an alternative configuration corresponding to the view shown in FIG. 1, but in this case rotated through 90 degrees. In this exemplary embodiment, the bit lines 1 are formed as $n^+$-conductively doped strip-like regions in a semiconductor body 7 that forms the substrate. The storage regions 3 and the electrodes 4 of the metalization memory cells are located between the bit lines 1 and the word lines 2 applied to the top side. The dielectric material 5 is located between the semiconductor body 7 and the word lines 2. In this exemplary embodiment too, the word lines 2 may be a material that is used for interconnect structures, e.g., Al, Cu, W.

In the exemplary embodiment shown in FIG. 2, the metalizations 6 of the bit lines 1, if present, may, for example, be trench fillings of an electrically conductive material running along the bit lines 1. Alternatively, there may be metalization levels that adjoin the bit lines if the semiconductor material of the bit lines is deposited at a later stage or grown epitaxially. In this exemplary embodiment, the bit lines are insulated from one another by the undoped semiconductor material, which is present between them, or by separating trenches, which are filled with a dielectric.

The bit lines may be formed from metal rather than from doped semiconductor material. In this case, there is in each case a further region of n-conductively doped semiconductor material between the bit line and the storage region. Corresponding exemplary embodiments are illustrated in FIGS. 3 and 4.

Figure 3:
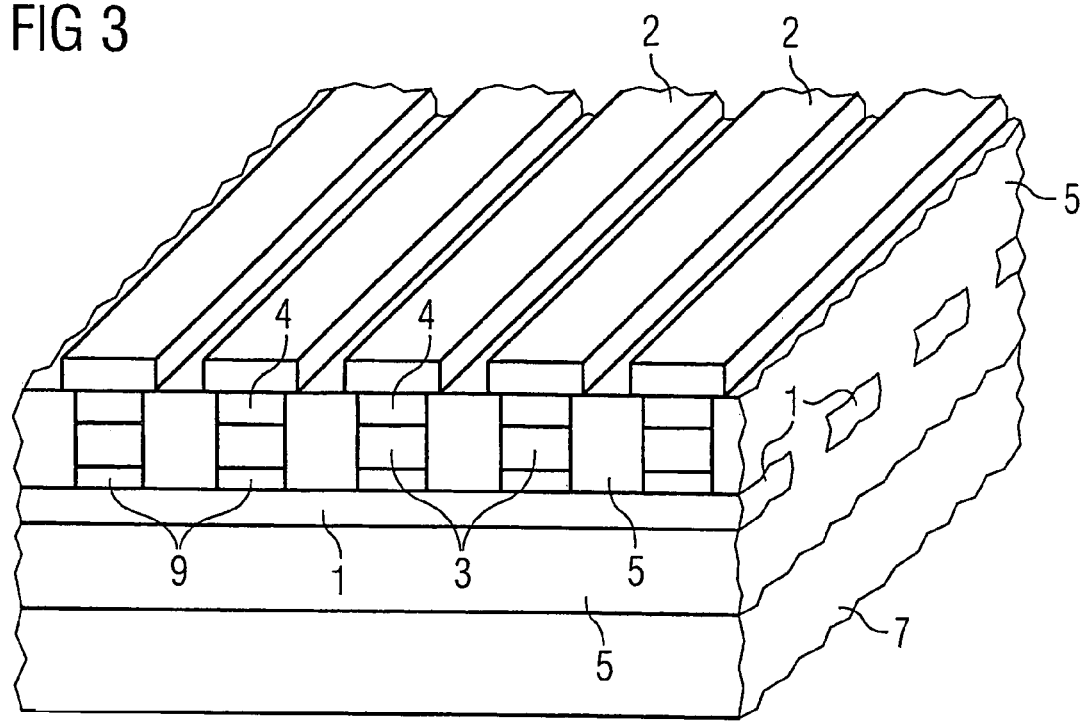
FIG. 3 shows a third exemplary embodiment of the component in the form of an oblique sectional view.

The exemplary embodiment in accordance with FIG. 3 corresponds to the exemplary embodiment in accordance with FIG. 1, except that the bit lines 1 are metal and a semiconductor region 9 is present between a bit line 1 and a respective storage region 3. The semiconductor region 9 is n-conductively doped and may, for example, be $n^+$-conductively doped polysilicon, which has been introduced in the manner of a contact hole filling.

Figure 4:
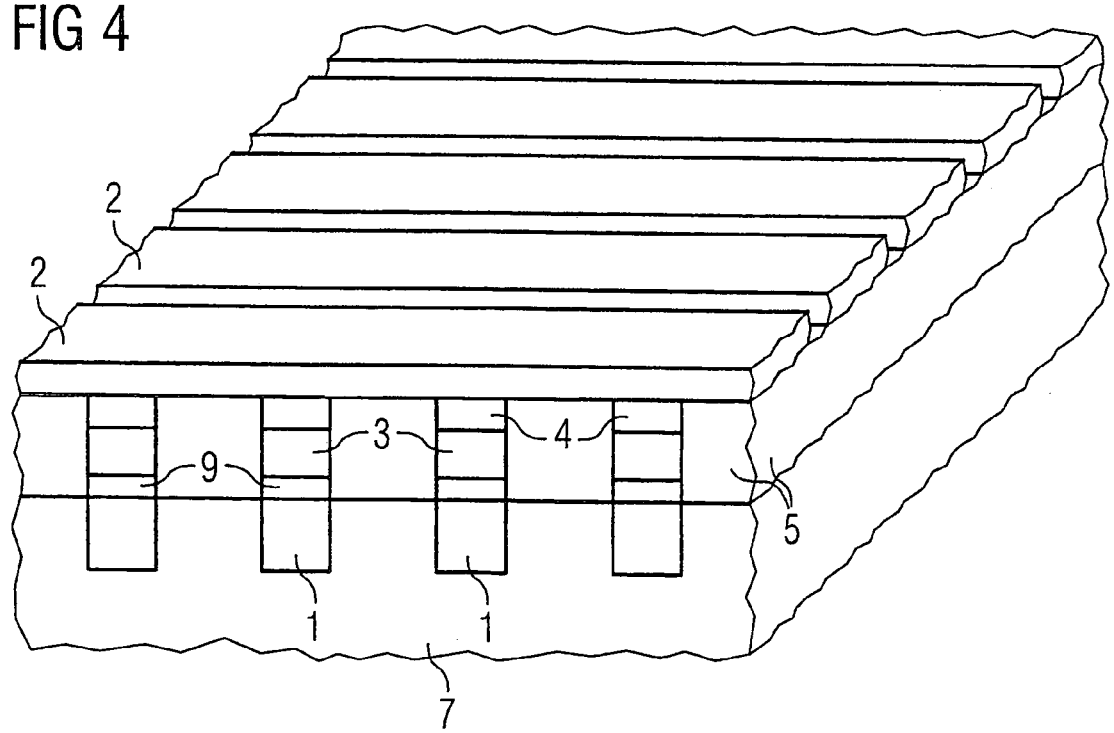
FIG. 4 shows a fourth exemplary embodiment of the component in the form of an oblique sectional view.

The exemplary embodiment shown in FIG. 4 corresponds to the exemplary embodiment shown in FIG. 2, with the bit lines 1 likewise being metal and a semiconductor region 9 being present between a bit line 1 and a respective storage region 3, as in the exemplary embodiment shown in FIG. 3. The metallic bit lines 1 are arranged in trenches in the semiconductor body 7.

The upper electrode 4 is preferably silver or alternatively copper; as an alternative, however, it is also possible to provide an electrode made from a metal, which behaves passively with respect to a metalization memory cell, in particular to provide an interconnect metal, such as for example tungsten, used for conventional wirings or metalizations. In an exemplary embodiment of this type, a metal doping with a concentration gradient is provided in the chalcogenide glass, so that the doping concentration increases toward the electrode 4. A metal doping gradient in the chalcogenide glass of the storage region 3 can also be provided when using an electrode 4 made from silver or copper, in this case if appropriate only being produced during programming of the memory cell.

What is claimed is:

1. A semiconductor memory device in cross-point architecture with programmable metalization memory cells, the semiconductor memory device comprising:
   bit lines arranged parallel to and at a distance from one another;
   word lines made from electrically conductive material, the word lines being arranged transversely with respect to the bit lines and parallel to and at a distance from one another; and
   a memory cell arranged at a crossing point of a respective bit line and a respective word line, the memory cell having:
      a storage region between the respective bit line and the respective word line, said storage region having a first surface toward said bit lines and a second surface, the storage region including a chalcogenide glass;
      an n+ conductively doped polysilicon region in contact with said first surface of said storage region forming a pn junction; and
      an electrode between the second surface of said storage region and the respective word line.

2. The semiconductor memory device as claimed in claim 1, wherein the n+ conductively doped polysilicon regions are strip-like and form the bit lines.

3. The semiconductor memory device as claimed in claim 2, wherein the bit lines further include a metalization formed from a low-resistance material.

4. The semiconductor memory device as claimed in claim 1, wherein the bit lines are embedded in dielectric material.

5. The semiconductor memory device as claimed in claim 1, wherein the electrode comprises silver.

6. The semiconductor memory device as claimed in claim 1, wherein the electrode comprises copper.

7. The semiconductor memory device as claimed in claim 1, wherein the storage region includes a metal doping with a gradient.

8. The semiconductor memory device as claimed in claim 1, wherein the storage region comprises arsenic sulfide or germanium sulfide.

9. The semiconductor memory device as claimed in claim 1 wherein the storage region comprises arsenic selenide, silver selenide or germanium selenide.

10. The semiconductor memory device as claimed in claim 1, wherein the chalcogenide glass of the storage region has a metal doping with silver.

11. The semiconductor memory device as claimed in claim 1, wherein the chalcogenide glass of the storage region has a metal doping with copper.

12. The semiconductor memory device as claimed in claim 1, wherein the electrode forms a metalization memory cell.

13. A memory device comprising:
   a bit line extending in a first direction;
   an n+ conductively doped polysilicon region electrically coupled to the bit line;
   a chalcogenide glass region having a first surface and a second surface, said first surface in contact with the doped polysilicon region, the interface between said chalcogenide glass region and the doped polysilicon region forming a pn junction;
   a metal electrode adjacent the second surface of said chalcogenide glass region such that the chalcogenide glass region is between the metal electrode and the semiconductor region; and
   a word line electrically coupled to the metal electrode, the word line extending in a second direction transverse to the first direction.

14. The memory device of claim 13, wherein the bit line comprises a metal line extending the first direction and the doped polysilicon region comprises a semiconductor line that extends adjacent to the bit line in the first direction.

15. The memory device of claim 14, wherein the semiconductor line extends over the metal line.

16. The memory device of claim 14, wherein the metal line extends next to the semiconductor line and is laterally displaced relative to the chalcogenide glass region and the metal electrode.

17. The memory device of claim 13 wherein:
the bit line comprises a metal line;
the doped polysilicon region overlies the bit line;
the chalcogenide glass region overlies the doped polysilicon region;
the metal electrode overlies the chalcogenide glass region; and
doped polysilicon region, the chalcogenide glass region, and the metal electrode each have substantially the same shape.

18. The memory device of claim 13 wherein said doped polysilicon regions and said bit line are the same structures.

* * * * *